United States Patent
Johnson et al.

(10) Patent No.: US 9,825,191 B2
(45) Date of Patent: Nov. 21, 2017

(54) PASSIVATION OF LIGHT-RECEIVING SURFACES OF SOLAR CELLS WITH HIGH ENERGY GAP (EG) MATERIALS

(71) Applicant: SUNPOWER CORPORATION, San Jose, CA (US)

(72) Inventors: Michael C. Johnson, Alameda, CA (US); Kieran Mark Tracy, San Jose, CA (US); Seung Bum Rim, Palo Alto, CA (US); Jara Fernandez Martin, Paris (FR); Périne Jaffrennou, San Francisco, CA (US); Julien Penaud, Kraainem (BE)

(73) Assignees: SunPower Corporation, San Jose, CA (US); Total Marketing Services, Puteaux (FR)

( * ) Notice: Subject to any disclaimer, the term of this patent is extended or adjusted under 35 U.S.C. 154(b) by 307 days.

(21) Appl. No.: 14/317,686

(22) Filed: Jun. 27, 2014

(65) Prior Publication Data

US 2015/0380574 A1    Dec. 31, 2015

(51) Int. Cl.
*H01L 31/0216*     (2014.01)
*H01L 31/0236*     (2006.01)
*H01L 31/068*      (2012.01)

(52) U.S. Cl.
CPC .. *H01L 31/02167* (2013.01); *H01L 31/02363* (2013.01); *H01L 31/0682* (2013.01); *Y02E 10/547* (2013.01)

(58) Field of Classification Search
CPC ........... H01L 31/02363; H01L 31/0682; H01L 31/02167

(Continued)

(56) References Cited

U.S. PATENT DOCUMENTS

2006/0157733 A1*  7/2006  Lucovsky ......... H01L 21/28194
                                                    257/192
2009/0056800 A1    3/2009  Ulyashin et al.
(Continued)

OTHER PUBLICATIONS

Gallium Nitride (GaN) Band Structure, New SEmiconductor Materials, Ioffe Institute (http://www.ioffe.ru/SVA/NSM/Semicond/GaN/bandstr.html) (downloaded Apr. 25, 2017).*

(Continued)

*Primary Examiner* — Jayne Mershon
(74) *Attorney, Agent, or Firm* — Schwabe, Williamson & Wyatt P.C.

(57) ABSTRACT

Methods of passivating light-receiving surfaces of solar cells with high energy gap (Eg) materials, and the resulting solar cells, are described. In an example, a solar cell includes a substrate having a light-receiving surface. A passivating dielectric layer is disposed on the light-receiving surface of the substrate. A Group III-nitride material layer is disposed above the passivating dielectric layer. In another example, a solar cell includes a substrate having a light-receiving surface. A passivating dielectric layer is disposed on the light-receiving surface of the substrate. A large direct band gap material layer is disposed above the passivating dielectric layer, the large direct band gap material layer having an energy gap (Eg) of at least approximately 3.3. An anti-reflective coating (ARC) layer disposed on the large direct band gap material layer, the ARC layer comprising a material different from the large direct band gap material layer.

20 Claims, 5 Drawing Sheets

(58) Field of Classification Search
USPC .......................................................... 136/256
See application file for complete search history.

(56) References Cited

U.S. PATENT DOCUMENTS

| | | | |
|---|---|---|---|
| 2010/0258168 A1 | 10/2010 | Yu et al. | |
| 2011/0136285 A1 | 6/2011 | Kim | |
| 2012/0199935 A1* | 8/2012 | Chen | H01L 31/02161 257/461 |
| 2012/0222731 A1* | 9/2012 | Hsieh | H01L 31/0747 136/255 |
| 2012/0291863 A1* | 11/2012 | Suh | H01L 31/02167 136/256 |
| 2013/0112253 A1 | 5/2013 | Oh et al. | |
| 2013/0112255 A1* | 5/2013 | McSporran | C03C 17/36 136/256 |
| 2013/0175648 A1 | 7/2013 | Kim et al. | |
| 2013/0186460 A1* | 7/2013 | Chen | B82Y 20/00 136/256 |
| 2013/0247965 A1 | 9/2013 | Swanson et al. | |
| 2013/0298973 A1* | 11/2013 | Xie | H01L 31/072 136/255 |
| 2015/0020877 A1* | 1/2015 | Moslehi | H01L 31/022441 136/256 |
| 2015/0027522 A1* | 1/2015 | Mueller | H01L 31/02363 136/256 |
| 2015/0206989 A1* | 7/2015 | Wolke | H01L 31/02167 136/256 |

OTHER PUBLICATIONS

International Preliminary Report on Patentability for PCT Patent Application No. PCT/US2015/037820 dated Jan. 5, 2017, 12 pgs.
International Search Report and Written Opinion for PCT Patent Application No. PCT/US2015/037820 dated Oct. 15, 2015, 15 pgs.
Extended European Search Report from European Patent Application No. 15812315.8 dated Apr. 21, 2017, 8 pgs.

* cited by examiner

PASSIVATION OF LIGHT-RECEIVING SURFACES OF SOLAR CELLS WITH HIGH ENERGY GAP (EG) MATERIALS

TECHNICAL FIELD

Embodiments of the present disclosure are in the field of renewable energy and, in particular, methods of passivating light-receiving surfaces of solar cells with high energy gap (Eg) materials, and the resulting solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures as well as improved stability by eliminating common degradation modes.

BRIEF DESCRIPTION OF THE DRAWINGS

FIGS. 1A-1E illustrate cross-sectional views of various stages in the fabrication of a solar cell, in accordance with an embodiment of the present disclosure, wherein:

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Methods of passivating light-receiving surfaces of solar cells with high energy gap (Eg) materials, and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are solar cells. In one embodiment, a solar cell includes a substrate having a light-receiving surface. A passivating dielectric layer is disposed on the light-receiving surface of the substrate. A Group III-nitride material layer is disposed above the passivating dielectric layer.

In another embodiment, a solar cell includes a substrate having a light-receiving surface. A passivating dielectric layer is disposed on the light-receiving surface of the substrate. A large direct band gap material layer is disposed above the passivating dielectric layer, the large direct band gap material layer having an energy gap (Eg) of at least approximately 3.3. An anti-reflective coating (ARC) layer disposed on the large direct band gap material layer, the ARC layer comprising a material different from the large direct band gap material layer.

In another embodiment, a solar cell includes a crystalline silicon substrate having a light-receiving surface. A Group III-nitride material layer is disposed above the light-receiving surface of the crystalline silicon substrate. An anti-reflective coating (ARC) layer is disposed on the Group III-nitride material layer. The ARC layer includes a material different from the Group III-nitride material layer.

Also disclosed herein are methods of fabricating solar cells. In one embodiment, a method of fabricating a solar cell involves forming a passivating dielectric layer on a light-receiving surface of a substrate. The method also involves forming a Group III-nitride material layer above the passivating dielectric layer. The method also involves forming an anti-reflective coating (ARC) layer on the Group III-nitride material layer.

One or more embodiments described herein are directed to approaches for achieving improved front surface field (FSF) performance for solar cells. In one embodiment, improved FSF performance is achieved using a high energy gap (Eg) material interlayer to provide improved efficiency and/or reliability. For example, one or more embodiments are directed to methods for improved light induced degradation (LID) for solar cells using high Eg materials. The high Eg group III-nitride layer can be implemented to stabilizing front surface degradation. In a particular embodiment, inserting a material such as, but not limited to, AlGaN, AlN or GaN, can provide stability of the resulting solar cell. Such a high Eg material layer may be implemented as both a passivation layer and as an approach for mitigating or eliminating light induced degradation and UV degradation.

To provide context, light induced degradation is a common issue for solar cells due to high energy photons decreasing the passivation levels of the interface of the substrate and subsequent layers. Oxidation followed by a passivating anti-reflection coating (commonly SiN) is a common approach for depositing a front surface film set. More often, a diffusion process is used to enhance the passivation followed by a thermal oxidation and subsequent capping with a SiN layer. Unfortunately, such architectures may be subject to interface degradation when exposed to light, e.g., LID, which continually degrades the efficiency and power output of the cell. Initial degradation can be large (e.g., up to 10% loss) within days, dramatically limiting a modules power output. An approach for reducing such degradation involves the placement of UV blockers to limit the amount of degradation. However, this approach can decrease the amount of photo-generation, limiting the power output of a cell or module. Additionally, as the quality of front surface passivation increases, the interface can actually exhibit increased sensitivity to such degradation, rendering improved stability more critical for high power modules.

Additionally, the trend of the photovoltaic industry is to decrease the wafer thickness which can increase requirements related to surface passivation. One such requirement for silicon solar cells which should be considered during the cell design process is surface passivation of the wafers. For a material to act as a passivation layer, the material needs to minimize surface recombination to allow generated carriers to reach the junction and contribute to the photo current in a solar cell. Silicon dioxide was the first material used for solar cell coating and is known for good quality passivation of silicon in other applications. However, silicon dioxide can have disadvantages for photovoltaic (PV) applications. For example, silicon dioxide has a low refractive index (1.46) which may be too low to minimize the reflection from the front surface of a solar cell. In addition, high temperature processing leads to the disadvantage of decreasing bulk lifetime and increased processing costs. As mentioned above, an alternative material is SiN which has been found to have good properties as a passivating antireflective coating, and better optical parameters than silicon dioxide.

Addressing one or more of the above issues, in accordance with an embodiment of the present disclosure, improved UV stability is achieved by inserting a high Eg material between an oxide and capping anti-reflection coating on a light receiving surface of a solar cell. In one such embodiment, a high Eg material such as, but not limited to, AlN, AlGaN or GaN is used to improve stability of such cells, even under high intensity ultra-violet light conditions. In addition, the high Eg materials are also passivators for the solar cell, so a variety of thicknesses can be used to tailor the front surface architecture. An added benefit of including such a high Eg material layer in a solar cell is that the large, direct band-gaps render such a material layer as mostly transparent to near UV, visible and IR light and can be tailored to block specific wavelength ranges if desired. The high transparency can allow for uninterrupted photo-generation with zero or negligible absorbance of the excitation frequencies commonly used in solar cells.

In an embodiment, advantages of implementing a high Eg material layer in a stack of materials on a light receiving surface of a solar cell can include, but are not limited to, (a) excellent passivation of an n-type Si surface of a solar cell, (b) very good optical properties for the front surface of a solar cells allowing higher Jsc (c) improved long term reliability in the form of UV stability, (d) such structures may be applicable for different silicon orientations and surfaces, (e) use of an intrinsic high band gap layer can provide good passivation levels for a lightly n-doped Si surface, (f) use of an n-doped high band gap layer can provide a band bending effect, and/or (g) thermal stability for solar cell fabrication processes requiring high temperature processing.

FIGS. 1A-1E illustrate cross-sectional views of various stages in the fabrication of a solar cell, in accordance with an embodiment of the present disclosure. FIG. 2 is a flowchart listing operations in a method of fabricating a solar cell as corresponding to FIGS. 1A-1E, in accordance with an embodiment of the present disclosure.

Figure 1A:
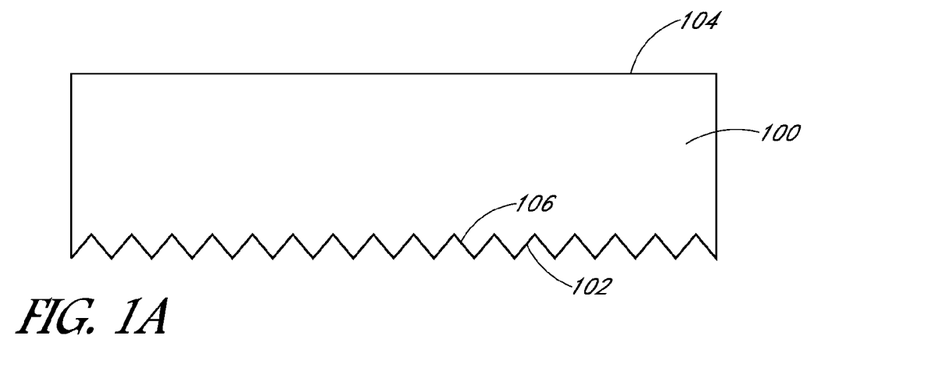
FIG. 1A illustrates a starting substrate of a solar cell.
Figure 2:
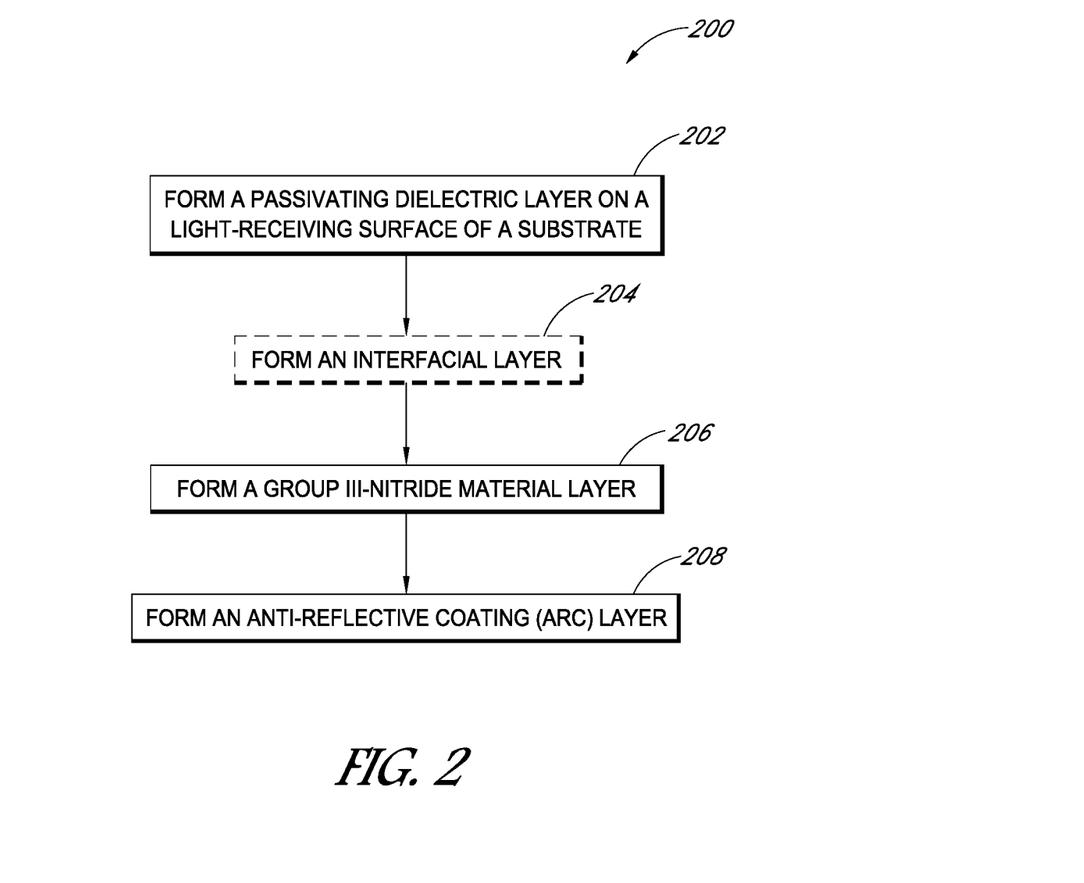
FIG. 2 is a flowchart listing operations in a method of fabricating a solar cell as corresponding to FIGS. 1A-1E, in accordance with an embodiment of the present disclosure.

FIG. 1A illustrates a starting substrate of a solar cell. Referring to FIG. 1A, substrate 100 has a light-receiving surface 102 and a back surface 104. In an embodiment, the substrate 100 is a monocrystalline silicon substrate, such as a bulk single crystalline N-type or P-type doped silicon substrate. It is to be appreciated, however, that substrate 100 may be a layer, such as a multi-crystalline silicon layer, disposed on a global solar cell substrate. In an embodiment, the light-receiving surface 102 has a texturized topography 106. In one such embodiment, a hydroxide-based wet etchant is employed to texturize the front surface of the substrate 100. It is to be appreciated that a texturized surface may be one which has a regular or an irregular shaped surface for scattering incoming light, decreasing the amount of light reflected off of the light-receiving surfaces of the solar cell.

Figure 1B:
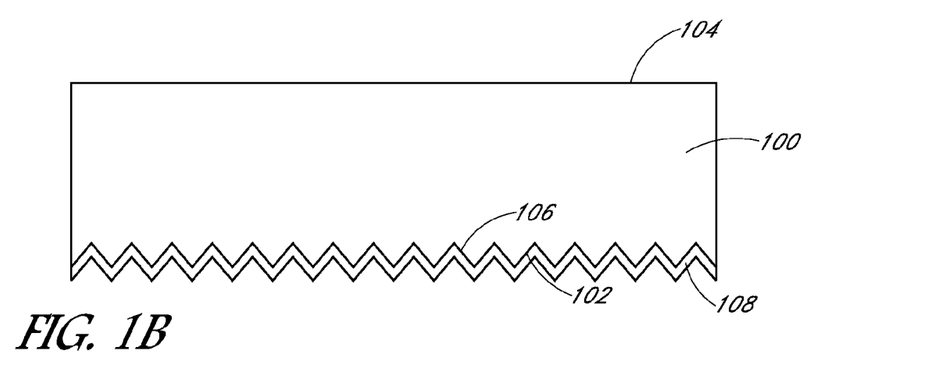
FIG. 1B illustrates the structure of FIG. 1A following formation of a passivating dielectric layer on a light-receiving surface of the substrate.

FIG. 1B illustrates the structure of FIG. 1A following formation of an optional passivating dielectric layer on a light-receiving surface of the substrate. Referring to FIG. 1B and corresponding operation 202 of flowchart 200, a passivating dielectric layer 108 is formed on the light-receiving surface 102 of substrate 100. In one embodiment, the light-receiving surface 102 has a texturized topography 106, and the passivating dielectric layer 108 is conformal with the texturized topography 106, as is depicted in FIG. 1B. In an embodiment, the passivating dielectric layer is omitted.

In an embodiment, the passivating dielectric layer 108 is a layer of silicon dioxide ($SiO_2$). In one such embodiment, the layer of silicon dioxide ($SiO_2$) has a thickness approximately in the range of 10-300 Angstroms and, in some embodiments, less than 15 Angstroms. In one embodiment, the passivating dielectric layer 108 is hydrophilic. In an embodiment, the passivating dielectric layer 108 is formed by a technique such as, but not limited to, chemical oxidation of a portion of the light-receiving surface of the silicon substrate, plasma-enhanced chemical vapor deposition (PECVD) of silicon dioxide ($SiO_2$), thermal oxidation of a portion of the light-receiving surface of the silicon substrate, or exposure of the light-receiving surface of the silicon substrate to ultra-violet (UV) radiation in an $O_2$ or $O_3$ environment. In an embodiment, the passivating material may be materials other than silicon dioxide. The structure may include an AlOx layer deposited using ALD or PEALD with $H_2O$ or $O_3$ as the oxygen source. In other embodiments, a material layer such as SiON is used as the passivating material.

Figure 1C:
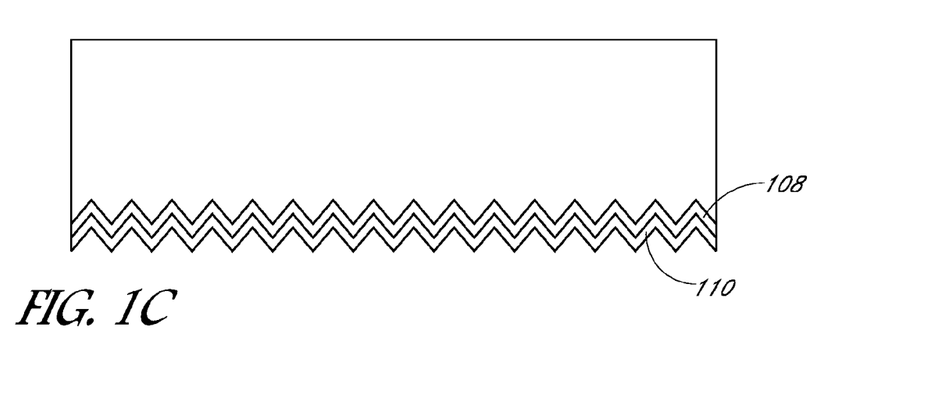
FIG. 1C illustrates the structure of FIG. 1B following formation of an optional interfacial layer on the passivating dielectric layer.

FIG. 1C illustrates the structure of FIG. 1B following formation of an optional interfacial layer on the passivating dielectric layer. Referring to FIG. 1C and corresponding operation 204 of flowchart 200, an interfacial layer 110 is optionally formed on the passivating dielectric layer 108. In one embodiment, as is depicted in FIG. 1C, the interfacial layer 110 is conformal with the texturized topography 106.

In an embodiment, the interfacial layer 110 is a material layer different from the above described passivating dielectric layer and different from the Group III-nitride material layer described below. In one such embodiment, the interfacial layer 110 is a silicon-rich amorphous silicon layer, e.g., an amorphous silicon layer having very little hydrogen therein. In a particular such embodiment, the silicon-rich amorphous silicon layer has a thickness approximately in the range of 30-100 Angstroms. In another embodiment, the interfacial layer is a silicon-based layer with no oxygen, such as but not limited to silicon-rich amorphous silicon, intrinsic or phosphorus doped amorphous silicon, and polycrystalline silicon, and the silicon-based layer has a thickness approximately in the range 10-200 Angstroms.

In an embodiment, an interfacial layer is omitted in cases where a low aluminum (Al) and/or low thermal budget Group III-N film used as a high Eg material layer. In an embodiment, an interfacial layer is used to prevent Al—O bond formation at between a silicon dioxide passivating dielectric layer and an Al-containing high Eg material layer.

Figure 1D:
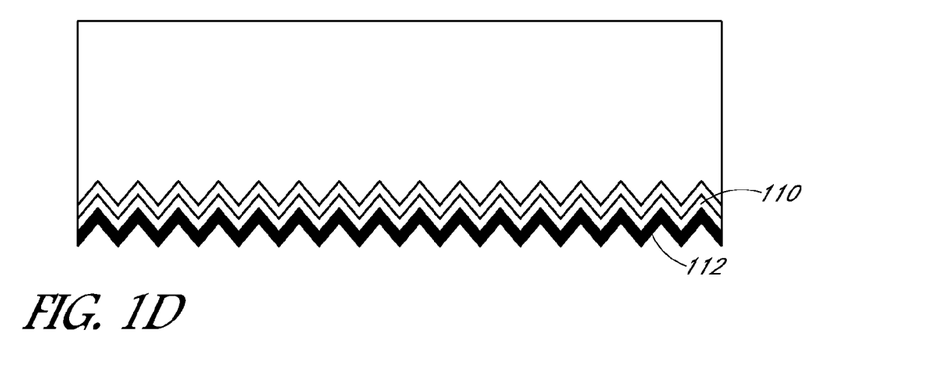
FIG. 1D illustrates the structure of FIG. 1C following formation of a Group III-nitride material layer on the interfacial layer.

FIG. 1D illustrates the structure of FIG. 1C following formation of a Group III-nitride material layer on the interfacial layer. Referring to FIG. 1D and corresponding operation 206 of flowchart 200, a Group III-nitride material layer 112 is formed on the interfacial layer 110 (if present, as is depicted) or on the passivating dielectric layer 108 (if the interfacial layer 110 is not present). In one embodiment, as is depicted in FIG. 1D, the Group III-nitride material layer 112 is conformal with the texturized topography 106.

In an embodiment, a subsequent post deposition anneal is performed approximately in the range of 350-700 degrees Celsius. The post deposition anneal may improve the passivation level of the Group III-nitride material layer 112. In an embodiment, the Group III-nitride material layer 112 is either an intrinsic layer or is doped as an N-type layer.

In an embodiment, the Group III-nitride material layer 112 is a material layer is such as, but not limited to, an aluminum nitride (AlN) layer, an aluminum gallium nitride ($Al_xGa_{1-x}N$, where 0<x<1) layer, or a gallium nitride (GaN) layer. In an embodiment, layer 112 is a large direct band gap material layer having an energy gap (Eg) of at least approximately 3.3.

In an embodiment, the Group III-nitride material layer 112 is formed as a polycrystalline layer such as, but not limited to, an aluminum nitride (AlN) polycrystalline layer, an aluminum gallium nitride ($Al_xGa_{1-x}N$, where 0<x<1) polycrystalline layer, or a gallium nitride (GaN) polycrystalline layer. In one such embodiment, the polycrystalline layer is formed by metal-organic chemical vapor deposition (MOCVD) or molecular beam epitaxy (MBE). In other embodiments, the polycrystalline layer is formed by plasma-enhanced chemical vapor deposition (PECVD), by plasma-enhanced atomic layer deposition (PEALD), by molecular beam epitaxy (MBE), or by physical vapor deposition (PVD).

In an embodiment, the Group III-nitride material layer 112 is formed as an amorphous layer such as, but not limited to, an aluminum nitride (AlN) amorphous layer, an aluminum gallium nitride ($Al_xGa_{1-x}N$, where 0<x<1) amorphous layer, or a gallium nitride (GaN) amorphous layer. In one such embodiment, the amorphous layer is formed by a technique such as, but not limited to, plasma-enhanced chemical vapor deposition (PECVD), atomic layer deposition (ALD), plasma-enhanced atomic layer deposition (PEALD), molecular beam epitaxy (MBE), or physical vapor deposition (PVD).

Figure 1E:
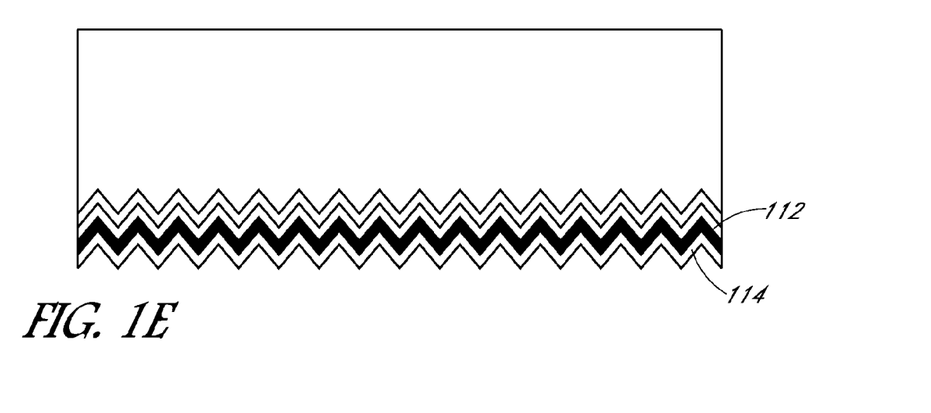
FIG. 1E illustrates the structure of FIG. 1D following formation of an anti-reflective coating (ARC) layer on the Group III-nitride material layer.

FIG. 1E illustrates the structure of FIG. 1D following formation of an anti-reflective coating (ARC) layer on the Group III-nitride material layer. Referring to FIG. 1E and corresponding operation 208 of flowchart 200, an anti-reflective coating (ARC) layer 114 is formed on the Group III-nitride material layer 112. In one embodiment, as is depicted in FIG. 1E, the ARC layer 114 is conformal with the texturized topography 106.

In an embodiment, the ARC layer 114 is a material layer different from the Group III-nitride material layer 112. In an embodiment, a post-deposition anneal of less than approximately 600 degrees Celsius is performed following deposition of the ARC layer 114. In an embodiment, the ARC layer 114 includes at least some hydrogen (H) and can passivate an N-doped Si surface by delivering H to the surface during or subsequent to deposition of the ARC layer 114.

In a first embodiment, the ARC layer 114 is a material layer such as, but not limited to, an aluminum oxide ($AlO_x$, x is equal to or less than 1.5) layer or a silicon oxynitride ($SiO_yN_z$, y>0, z>0) layer. In one such embodiment, the ARC layer 114 and the Group III-nitride material layer 112 together form a dual layer anti-reflective coating for an ultimately fabricated solar cell. In an embodiment, the Group III-nitride material layer 112 has a thickness approximately in the range of 50-600 Angstroms and has an index of refraction of approximately 2.4. In that embodiment, the ARC layer 114 has a thickness approximately in the range of 300-1000 Angstroms and has an index of refraction of approximately 1.8. In one such embodiment, the Group III-nitride material layer 112 and the ARC layer 114 together provide current enhancement and stability for an ultimately fabricated solar cell.

In a second embodiment, the ARC layer 114 is a layer of hydrogenated silicon nitride (SiN:H). In an embodiment, the Group III-nitride material layer 112 has a thickness approximately in the range of 30-100 Angstroms and has an index of refraction approximately in the range of 2.0-2.4. In that embodiment, the layer of SiN:H (ARC layer 114) has a thickness of approximately 700 Angstroms and has an index of refraction greater than approximately 1.9. In one such embodiment, the Group III-nitride material layer 112 and the ARC layer 114 together provide stability for an ultimately fabricated solar cell.

Figure 3:
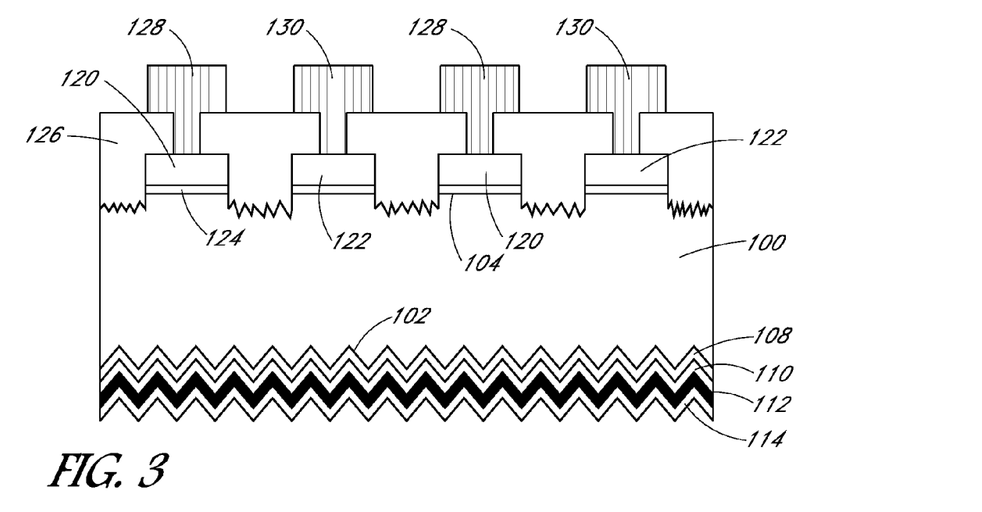
FIG. 3 illustrates a cross-sectional view of a back-contact solar cell having emitter regions formed above a back surface of a substrate and having an exemplary stack of layers including a high energy gap (Eg) material on a light-receiving surface of the substrate, in accordance with an embodiment of the present disclosure.

FIG. 3 illustrates a cross-sectional view of a back-contact solar cell having emitter regions formed above a back surface of a substrate and having an exemplary stack of layers including a high energy gap (Eg) material on a light-receiving surface of the substrate, in accordance with an embodiment of the present disclosure.

Referring to FIG. 3, a solar cell includes a silicon substrate 100 having a light-receiving surface 102. A passivating dielectric layer 108 is disposed on the light-receiving surface of the silicon substrate 100. An interfacial layer 110 is optionally disposed on the passivating dielectric layer 108. A Group III-nitride material layer 112 is disposed on the interfacial layer 110 (if present) or on the passivating dielectric layer 108. An anti-reflective coating (ARC) layer 114 is disposed on the Group III-nitride material layer 112. As such, the stack of layers on the light-receiving surface of the solar cell of FIG. 3 is the same as, or similar to, that described in association with FIG. 1A-1E.

Referring again to FIG. 3, on the back surface of the substrate 100, alternating P-type 120 and N-type 122 emitter regions are formed. In one such embodiment, trenches 121 are disposed between the alternating P-type 120 and N-type 122 emitter regions. More particularly, in an embodiment, first polycrystalline silicon emitter regions 122 are formed on a first portion of a thin dielectric layer 124 and are doped with an N-type impurity. Second polycrystalline silicon emitter regions 120 are formed on a second portion of the thin dielectric layer 124 and are doped with a P-type impurity. In an embodiment the tunneling dielectric 124 is a silicon oxide layer having a thickness of approximately 2 nanometers or less.

Referring again to FIG. 3, conductive contact structures 128/130 are fabricated by first depositing and patterning an insulating layer 126 to have openings and then forming one or more conductive layers in the openings. In an embodiment, the conductive contact structures 128/130 include metal and are formed by a deposition, lithographic, and etch approach or, alternatively, a printing or plating process or, alternatively, a foil adhesion process.

Figure 4:
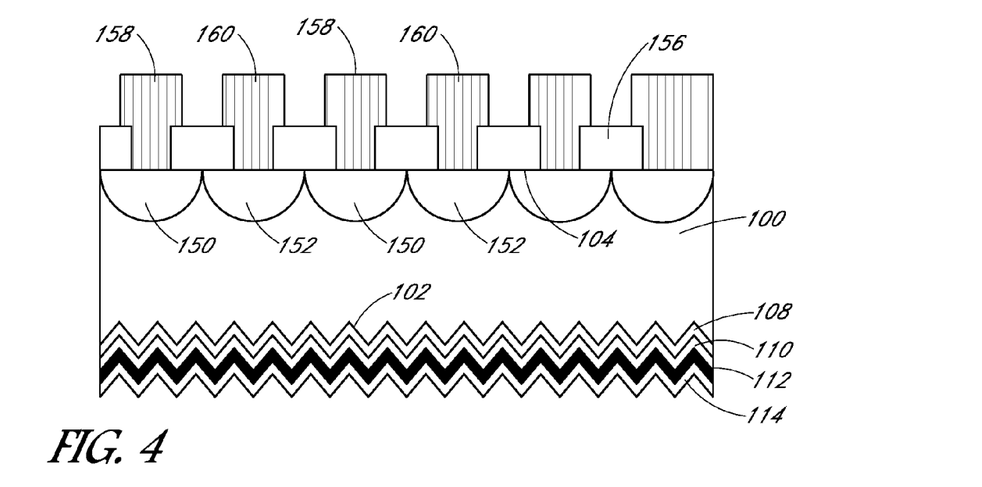
FIG. 4 illustrates a cross-sectional view of a back-contact solar cell having emitter regions formed in a back surface of a substrate and having an exemplary stack of layers including a high energy gap (Eg) material on a light-receiving surface of the substrate, in accordance with an embodiment of the present disclosure.

FIG. 4 illustrates a cross-sectional view of a back-contact solar cell having emitter regions formed in a back surface of a substrate and having an exemplary stack of layers including a high energy gap (Eg) material on a light-receiving surface of the substrate, in accordance with an embodiment of the present disclosure.

Referring to FIG. 4, a solar cell includes a silicon substrate 100 having a light-receiving surface 102. A passivating dielectric layer 108 is disposed on the light-receiving surface of the silicon substrate 100. An interfacial layer 110 is optionally disposed on the passivating dielectric layer 108. A Group III-nitride material layer 112 is disposed on the interfacial layer 110 (if present) or on the passivating dielectric layer 108. An anti-reflective coating (ARC) layer 114 is disposed on the Group III-nitride material layer 112. As such, the stack of layers on the light-receiving surface of the solar cell of FIG. 4 is the same as, or similar to, that described in association with FIG. 1A-1E.

Referring again to FIG. 4, within the back surface of the substrate 100, alternating P-type 150 and N-type 152 emitter regions are formed. More particularly, in an embodiment, first emitter regions 152 are formed within a first portion of substrate 100 and are doped with an N-type impurity. Second emitter regions 150 are formed within a second portion of substrate 100 and are doped with a P-type impurity.

Referring again to FIG. 4, conductive contact structures 158/160 are fabricated by first depositing and patterning an insulating layer 156 to have openings and then forming one or more conductive layers in the openings. In an embodiment, the conductive contact structures 158/160 include metal and are formed by a deposition, lithographic, and etch approach or, alternatively, a printing or plating process or, alternatively, a foil adhesion process.

It is to be appreciated that light induced degradation (LID) and/or ultra-violet (UV) degradation pose long standing issues for the long term stability of solar cell performance. High efficiency solar cells are especially subject to such degradation modes due to their increased sensitivity of the front surface passivation. Efforts have been exerted in improving the stability of such solar cells without compromising performance in the form of decreased passivation or solar spectrum absorption (e.g., Jsc loss). Performance stability may be critical for performance guarantees and for product quality differentiation. More particularly, front surface passivation can be critical for performance of high efficiency solar cells. Typically, front surface passivation is performed using a diffusion process followed by a high temperature oxidation and, finally, capping with an antireflection coating (ARC) using plasma-enhanced chemical vapor deposition (PECVD). Silicon nitride (SiN or SiN:H) is commonly used as an ARC due to its optical properties and also for its excellent passivation qualities. A silicon nitride layer may be used to provide H+ to a crystalline silicon/thermal oxide (c-Si/TOX) interface. Unfortunately, the interface can be degraded by long term exposure to UV light via hot electron injection across the interface which breaks existing Si—H bonds. The hot electron can be trapped in the subsequent layers and be re-excited to bounce back and forth across the interface, which is a process known as interface wear.

Figure 5:
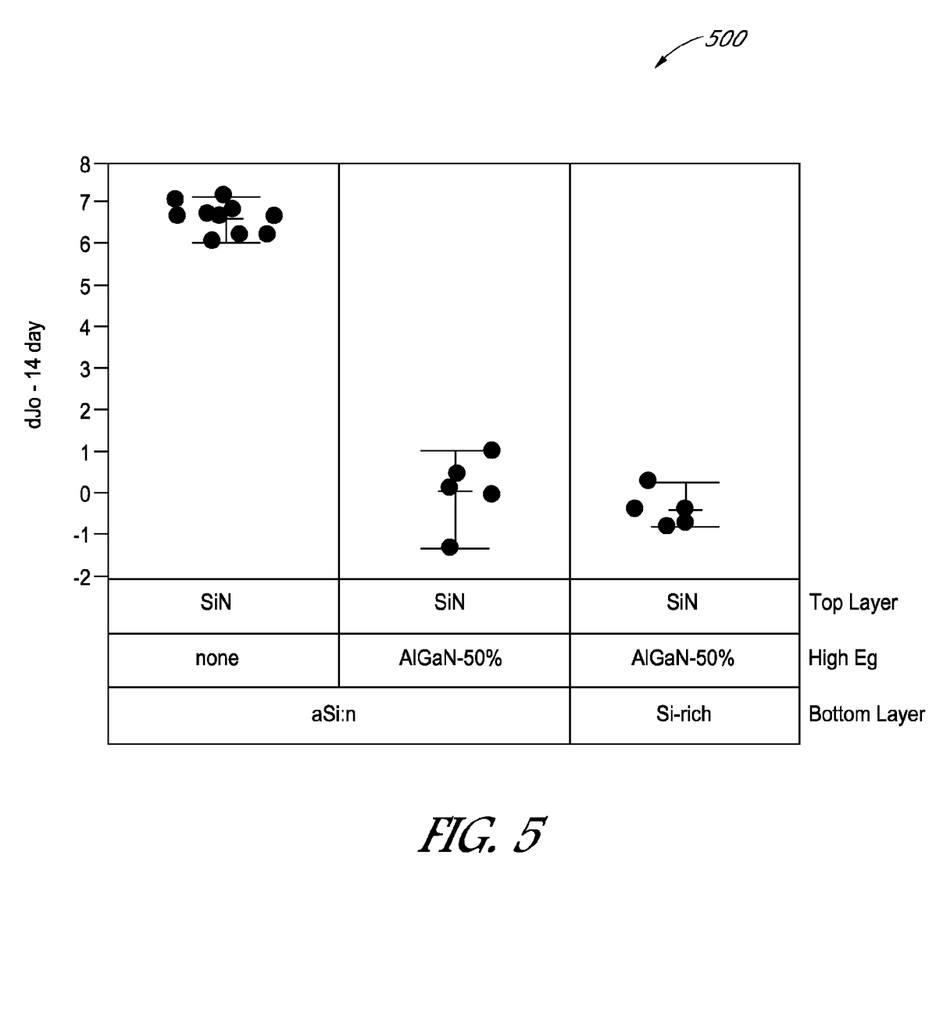
FIG. 5 is a plot demonstrating ultra-violet (UV) stability of a solar cell having a high Eg intermediate layer on a light-receiving surface of the solar cell, in accordance with an embodiment of the present disclosure.

One or more embodiments described herein address such LID and/or UV degradation issues. As an example, FIG. 5 is a plot 500 demonstrating ultra-violet (UV) stability of a solar cell having a high Eg intermediate layer on a light-receiving surface of the solar cell, in accordance with an embodiment of the present disclosure. Referring to plot 500, a 14 day high intensity ultra-violet test was performed for three different material layer stacks on a light receiving surface of a solar cell: (a) SiN/aSi:n, (b) SiN/AlGaN/aSi:n, and (c) SiN/AlGaN/Si-rich. A change is Jo is essentially eliminated with insertion of high Eg intermediate layer (AlGaN). Furthermore, initial Jo for all structures is <10 fA/cm$^2$ which is an indication good initial passivation for all exemplary cells. As such, the use of a high Eg material layer leased to essentially zero degradation under the tested parameters. This is an unprecedented finding for the photovoltaic industry.

Overall, although certain materials are described specifically above, some materials may be readily substituted with others with other such embodiments remaining within the spirit and scope of embodiments of the present disclosure. For example, in an embodiment, a different material substrate, such as a group III-V material substrate, can be used instead of a silicon substrate. In another embodiment, a polycrystalline or multi-crystalline silicon substrate is used. In another embodiment, a P-type substrate may be used. Furthermore, it is to be understood that, where N+ and P+ type doping is described specifically for emitter regions on a back surface of a solar cell, other embodiments contemplated include the opposite conductivity type, e.g., P+ and N+ type doping, respectively. Other embodiments are directed to cells having bi-facial designs. Additionally, although reference is made significantly to back contact solar cell arrangements, it is to be appreciated that approaches described herein may have application to front contact solar cells as well.

Thus, methods of passivating light-receiving surfaces of solar cells with high energy gap (Eg) materials, and the resulting solar cells, have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A solar cell, comprising:
a substrate having a light-receiving surface;
a passivating dielectric layer disposed on the light-receiving surface of the substrate;
a Group III-nitride material layer disposed above the passivating dielectric layer, wherein the Group III-nitride material layer comprises gallium; and
an interfacial layer disposed directly between the passivating dielectric layer and the Group III-nitride material layer, the interfacial layer comprising a material different from the passivating dielectric layer and different from the Group III-nitride material layer, wherein the interfacial layer is a silicon-rich amorphous silicon layer and has a thickness approximately in the range of 30-50 Angstroms.

2. The solar cell of claim 1, wherein the Group III-nitride material layer is disposed on the passivating dielectric layer.

3. The solar cell of claim 1, wherein the Group III-nitride material layer is selected from the group consisting of an aluminum gallium nitride ($Al_xGa_{1-x}N$, where 0<x<1) layer, and a gallium nitride (GaN) layer.

4. The solar cell of claim 1, further comprising:
an anti-reflective coating (ARC) layer disposed on the Group III-nitride material layer, the ARC layer comprising a material different from the Group III-nitride material layer.

5. The solar cell of claim 4, wherein the ARC layer is a layer selected from the group consisting of an aluminum oxide ($AlO_x$, x is equal to or less than 1.5) layer and a silicon oxynitride ($SiO_yN_z$, y>0, z>0) layer, and wherein the ARC layer and the Group III-nitride material layer together form a dual layer anti-reflective coating for the solar cell.

6. The solar cell of claim 5, wherein the Group III-nitride material layer has a thickness approximately in the range of 50-900 Angstroms and has an index of refraction of approximately 2.0-2.4, and wherein the ARC layer has a thickness approximately in the range of 300-1500 Angstroms and has an index of refraction of approximately 1.8.

7. The solar cell of claim 6, wherein the Group III-nitride material layer and the ARC layer together provide current enhancement and stability for the solar cell.

8. The solar cell of claim 4, wherein the ARC layer is a layer of hydrogenated silicon nitride (SiN:H).

9. The solar cell of claim 8, wherein the Group III-nitride material layer has a thickness approximately in the range of 30-100 Angstroms and has an index of refraction of approximately 2.0-2.4, and wherein the layer of SiN:H has a thickness of approximately 700 Angstroms and has an index of refraction greater than approximately 1.9.

10. The solar cell of claim 9, wherein the Group III-nitride material layer and the ARC layer together provide stability for the solar cell while the high band Eg material provides passivation with no absorption of the photogenerating spectrum.

11. The solar cell of claim 1, wherein the substrate is a crystalline silicon substrate, and the passivating dielectric layer is a layer of silicon dioxide ($SiO_2$) having a thickness approximately in the range of 10-300 Angstroms.

12. The solar cell of claim 1, wherein the light-receiving surface has a texturized topography, and wherein both the passivating dielectric layer and the Group III-nitride material layer are conformal with the texturized topography of the light-receiving surface.

13. The solar cell of claim 1, wherein the substrate further comprises a back surface opposite the light-receiving surface, the solar cell further comprising:
 a plurality of alternating N-type and P-type semiconductor regions at or above the back surface of the substrate; and
 a conductive contact structure electrically connected to the plurality of alternating N-type and P-type semiconductor regions.

14. A solar cell, comprising:
 a substrate having a light-receiving surface;
 a passivating dielectric layer disposed directly on the light-receiving surface of the substrate;
 an interfacial layer disposed directly on the passivating dielectric layer;
 a Group III-nitride material layer disposed directly on the interfacial layer, wherein the interfacial layer comprises a material different from the passivating dielectric layer and different from the Group III-nitride material layer; and
 an anti-reflective coating (ARC) layer disposed directly on the Group III-nitride material layer, the ARC layer comprising a material different from the Group III-nitride material layer, wherein the ARC layer and the Group III-nitride material layer together form a dual layer anti-reflective coating for the solar cell, wherein the interfacial layer is a silicon-rich amorphous silicon layer and has a thickness approximately in the range of 30-50 Angstroms, and wherein the ARC layer is a layer selected from the group consisting of an aluminum oxide ($AlO_x$, x is equal to or less than 1.5) layer and a silicon oxynitride ($SiO_yN_z$, $y>0$, $z>0$) layer.

15. A solar cell, comprising:
 a substrate having a light-receiving surface;
 a passivating dielectric layer disposed on the light-receiving surface of the substrate;
 a Group III-nitride material layer disposed above the passivating dielectric layer, wherein the Group III-nitride material layer comprises gallium; and
 an interfacial layer disposed directly between the passivating dielectric layer and the Group III-nitride material layer, the interfacial layer comprising a material different from the passivating dielectric layer and different from the Group III-nitride material layer, wherein the interfacial layer is a silicon-based layer with no oxygen, the layer selected from the group consisting of silicon-rich amorphous silicon, intrinsic or phosphorus doped amorphous silicon, and polycrystalline silicon, and wherein the silicon-based layer has a thickness approximately in the range 10-200 Angstroms.

16. The solar cell of claim 15, wherein the Group III-nitride material layer is disposed on the passivating dielectric layer.

17. The solar cell of claim 15, wherein the Group III-nitride material layer is selected from the group consisting of an aluminum gallium nitride ($Al_xGa_{1-x}N$, where $0<x<1$) layer, and a gallium nitride (GaN) layer.

18. The solar cell of claim 15, further comprising:
 an anti-reflective coating (ARC) layer disposed on the Group III-nitride material layer, the ARC layer comprising a material different from the Group III-nitride material layer.

19. The solar cell of claim 18, wherein the ARC layer is a layer selected from the group consisting of an aluminum oxide ($AlO_x$, x is equal to or less than 1.5) layer and a silicon oxynitride ($SiO_yN_z$, $y>0$, $z>0$) layer, and wherein the ARC layer and the Group III-nitride material layer together form a dual layer anti-reflective coating for the solar cell.

20. The solar cell of claim 19, wherein the Group III-nitride material layer has a thickness approximately in the range of 50-900 Angstroms and has an index of refraction of approximately 2.0-2.4, and wherein the ARC layer has a thickness approximately in the range of 300-1500 Angstroms and has an index of refraction of approximately 1.8.

* * * * *